(12) United States Patent
Shen et al.

(10) Patent No.: US 8,226,854 B2
(45) Date of Patent: Jul. 24, 2012

(54) PHOTOELECTRIC CONVERSION DEVICE, IMAGING DEVICE AND PHOTOSENSOR

(75) Inventors: Rui Shen, Tokyo (JP); Kimiatsu Nomura, Kanagawa (JP); Hideyuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 627 days.

(21) Appl. No.: 12/324,196

(22) Filed: Nov. 26, 2008

(65) Prior Publication Data

US 2009/0140123 A1    Jun. 4, 2009

(30) Foreign Application Priority Data

Nov. 30, 2007    (JP) ................. P2007-311167

(51) Int. Cl.
*H01B 1/06*    (2006.01)
*H01B 1/24*    (2006.01)

(52) U.S. Cl. .............. 252/510; 252/500; 252/501.1; 252/519.4; 257/40; 430/570; 430/573; 548/152; 548/161

(58) Field of Classification Search .......... 252/500, 252/501.1, 510, 519.4; 548/152, 157, 159, 548/161, 165, 170, 171, 174; 430/570, 573, 430/582, 586, 591, 593; 136/252, 243; 257/40
See application file for complete search history.

(56) References Cited

U.S. PATENT DOCUMENTS 5,965,875 A    10/1999    Merrill
(Continued)

FOREIGN PATENT DOCUMENTS

JP    11030833 A  *  2/1999
(Continued)

OTHER PUBLICATIONS

Machine translation Hirano JP 11030833, published 1999.*
(Continued)

*Primary Examiner* — Mark Eashoo
*Assistant Examiner* — Jane L Stanley
(74) *Attorney, Agent, or Firm* — Sughrue Mion, PLLC

(57) ABSTRACT

A photoelectric conversion device is provided and includes a photoelectric conversion layer containing a compound represented by the following formula (1). Formula (1):

$$R_1-N-(L_{11}=L_{12})_{p_1}-C=(L_{13}-L_{14})_{n_1}-C$$

with $Z_1$ and $Z_a$ groups, and $M_1 m_1$, $O$

In the formula, $Z_1$ represents an atomic group for forming a 5- or 6-membered nitrogen-containing heterocyclic ring; $Za$ represents an atomic group for forming a 5- or 6-membered ring; $R_1$ represents a hydrogen atom, an alkyl group, an alkenyl group, an aryl group or a heterocyclic group; $L_{11}$ to $L_{14}$ each represents a methine group which may have a substituent or may form a ring with another methine group; p1 represents 0 or 1; n1 represents an integer of 0 to 4 and when n1 is an integer of 2 or more, each $L_{13}$ or $L_{14}$ may be the same as or different from every other $L_{13}$ or $L_{14}$; M1 represents an ion for neutralizing the electric charge; and m1 represents a number necessary for neutralization of the electric charge; provided that a compound where $Z_1$ is an atomic group forming a thiazoline nucleus or a thiazole nucleus is excluded.

11 Claims, 3 Drawing Sheets

U.S. PATENT DOCUMENTS

| | | | |
|---|---|---|---|
| 6,350,946 B1* | 2/2002 | Miyake et al. | 136/252 |
| 6,667,405 B2* | 12/2003 | Kobayashi et al. | 548/207 |
| 7,161,010 B2* | 1/2007 | Kobayashi et al. | 548/149 |
| 2002/0076666 A1* | 6/2002 | Kobayashi et al. | 430/570 |
| 2004/0063962 A1* | 4/2004 | Kobayashi et al. | 548/151 |
| 2006/0054987 A1 | 3/2006 | Nii | |
| 2007/0215204 A1 | 9/2007 | Maehara | |
| 2008/0230123 A1* | 9/2008 | Mitsui et al. | 136/263 |
| 2010/0276670 A1* | 11/2010 | Shen et al. | 257/40 |
| 2011/0139969 A1 | 6/2011 | Nii | |

FOREIGN PATENT DOCUMENTS

| | | |
|---|---|---|
| JP | 11-214731 A | 8/1999 |
| JP | 2003-110132 A | 4/2003 |
| JP | 2003-282934 A | 10/2003 |
| JP | 2003-332551 A | 11/2003 |
| JP | 2004103275 A * | 4/2004 |
| JP | 2005-026116 A | 1/2005 |
| JP | 2006-100766 A | 4/2006 |
| JP | 2007-250890 A | 9/2007 |

OTHER PUBLICATIONS

Machine translation Hirai 2004103275, published 2004.*
EIC structure search of U.S. Appl. No. 12/324,196 claims.*
A.P. Piechowski, et al., "Desirable properties of Photovoltaic Dyes", J. Phys. Chem. 1984, vol. 88, pp. 934-950.
Japanese Patent Office, Office Action, dated Aug. 2, 2011, issued in counterpart Japanese Application No. 2007-311167.
Japanese Patent Office, Communication dated Apr. 17, 2012, in a counterpart application citing No. 2007-311167.

* cited by examiner

PHOTOELECTRIC CONVERSION DEVICE, IMAGING DEVICE AND PHOTOSENSOR

This application is based on and claims priority under 35 U.S.C. §119 from Japanese Patent Application No. 2007-311167 filed Nov. 30, 2007, the entire disclosure of which is herein incorporated by reference.

BACKGROUND OF THE INVENTION

1. Field of the Invention

The present invention relates to a photoelectric conversion device, an imaging device and a photosensor.

2. Description of Related Art

Visible light sensors in the related art are generally a device produced by forming a photoelectric conversion site through, for example, formation of PN junction in a semiconductor such as Si. As for a solid-state imaging device, there is widely used a flat light-receiving device where photoelectric conversion sites are two-dimensionally arrayed in a semiconductor to form pixels and a signal generated in each pixel through photoelectric conversion is charge-transferred and read out according to a CCD or CMOS format. The method for realizing a color solid-state imaging device is generally to fabricate a structure where on the light incident surface side of the flat image-receiving device, a color filter transmitting only light at a specific wavelength is disposed for color separation. Particularly, a single-plate sensor in which color filters transmitting blue light, green light and red light, respectively, are regularly disposed on each of two-dimensionally arrayed pixels is well known as a system widely used at present in a digital camera and the like.

In this system, since the color filter transmits only light at a limited wavelength, untransmitted light is not utilized and the light utilization efficiency is bad. Also, in recent years, amid the advance in the fabrication of a multipixel device, the pixel size and in turn, the area of a photodiode part becomes small and this brings about problems of reduction in the aperture ratio and reduction in the light collection efficiency.

In order to solve these problems, there may be thought out a system where photoelectric conversion parts capable of detecting light at different wavelengths are stacked in a longitudinal direction. As regards such a system, for example, U.S. Pat. No. 5,965,875 discloses a sensor utilizing wavelength dependency of the absorption coefficient of Si, where a vertical stacked structure is formed and the colors are separated by the difference in the depth, and JP-A-2003-332551 discloses a sensor by a stacked structure using an organic photoelectric conversion layer. However, color separation by the difference in the depth direction of Si is disadvantageously poor because the absorption range is overlapped among respective portions and the spectroscopic property is bad. As for other methods to solve the problems, a structure where a photoelectric conversion layer by amorphous silicon or an organic photoelectric conversion layer is formed on a signal reading substrate is known as a technique for increasing the aperture ratio.

Heretofore, several examples have been known for a photoelectric conversion device, an imaging device and a photosensor each using an organic photoelectric conversion layer. A high photoelectric conversion efficiency (exciton dissociation efficiency, charge transportability) and a low dark current (amount of carrier at dark time) are a problem in particular and for the improvement in this respect, there are disclosed, for example, introduction of pn junction or introduction of a bulk heterostructure for the former and introduction of a blocking layer for the latter.

These improvement methods by structure may produce a large effect, but the properties of the material used also greatly contribute to the device performance. There is almost no report or patent publication regarding the optical response speed which is another important parameter of the organic photoelectric conversion device (in particular, when applied as an imaging device or a photosensor). On the other hand, as regards a photocurrent multiplication device using an organic material (semiconductor), specific organic pigments are described in JP-A-2003-110132 and JP-A-2003-282934, but the response speed exhibited by such a photocurrent for the start of light irradiation (light-on) and the stop of light irradiation (light-off) is as slow as on the order of seconds (milliseconds at shortest), failing in satisfying a high response speed.

In use as a solid-state imaging device, all of high photoelectric conversion efficiency, low dark current and high response speed need to be satisfied, but there has not been specifically disclosed what an organic photoelectric conversion material or a device structure satisfies this requirement.

SUMMARY OF THE INVENTION

An object of an illustrative, non-limiting embodiment of the present invention is to provide a photoelectric conversion device, a solid-state imaging device and a photosensor each containing an organic material that exhibits high photoelectric conversion efficiency and high-speed responsivity.

The object can be attained by the following techniques.

(1) A photoelectric conversion device comprising a photoelectric conversion layer containing a compound represented by formula (1):

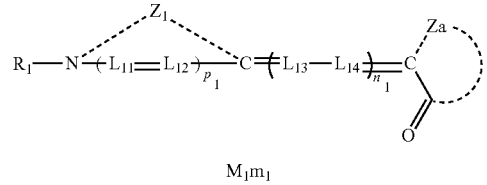

wherein $Z_1$ represents an atomic group forming a 5- or 6-membered nitrogen-containing heterocyclic ring; Za represents an atomic group forming a 5- or 6-membered ring; $R_1$ represents a hydrogen atom, an alkyl group, an alkenyl group, an aryl group or a heterocyclic group; $L_{11}$ to $L_{14}$ each represents a methine group which may have a substituent or may form a ring with another methine group; p1 represents 0 or 1; n1 represents an integer of 0 to 4 and when n1 is an integer of 2 or more, plural $L_{13}$'s may be the same or different from each other and plural $L_{14}$'s may be the same or different from each other, M1 represents an ion for neutralizing a electric charge of the compound; and m1 represents a number necessary for neutralization of the electric charge; provided that a compound where $Z_1$ is an atomic group forming a thiazoline nucleus or a thiazole nucleus is excluded.

(2) The photoelectric conversion device as described in (1), wherein the compound represented by formula (1) is a compound represented by formula (2):

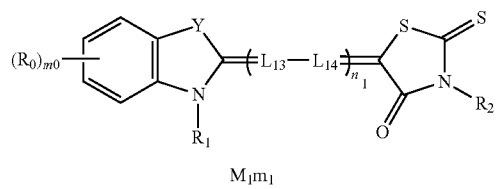

wherein Y represents O, N(Ra), Se or C(Rb)(Rc); Ra, Rb and Rc each independently represents an alkyl group, an alkenyl group or an aryl group; $R_0$ represents a substituent; m0 represents an integer of 0 to 4; $R_1$ and $R_2$ each independently represents a hydrogen atom, an alkyl group, an alkenyl group, an aryl group or a heterocyclic group; $L_{13}$ and $L_{14}$ each represents a methine group which may have a substituent or may form a ring with another methine group or $R_1$; n1 represents an integer of 0 to 4 and when n1 is an integer of 2 or more, plural $L_{13}$'s may be the same or different from each other $L_{13}$ and plural $L_{14}$'s may be the same or different from each other; M1 represents an ion for neutralizing an electric charge of the compound; and m1 represents a number necessary for neutralization of the electric charge.

(3) The photoelectric conversion device as described in (1) or (2), wherein the photoelectric conversion layer is formed by a vacuum vapor deposition method.

(4) An imaging device comprising a photoelectric conversion device described in any one of (1) to (3).

(5) A photosensor comprising a photoelectric conversion device described in any one of (1) to (3).

BRIEF DESCRIPTION OF THE DRAWINGS

The features of the invention will appear more fully upon consideration of the exemplary embodiments of the inventions, which are schematically set forth in the drawings, in which.

Figure 1:
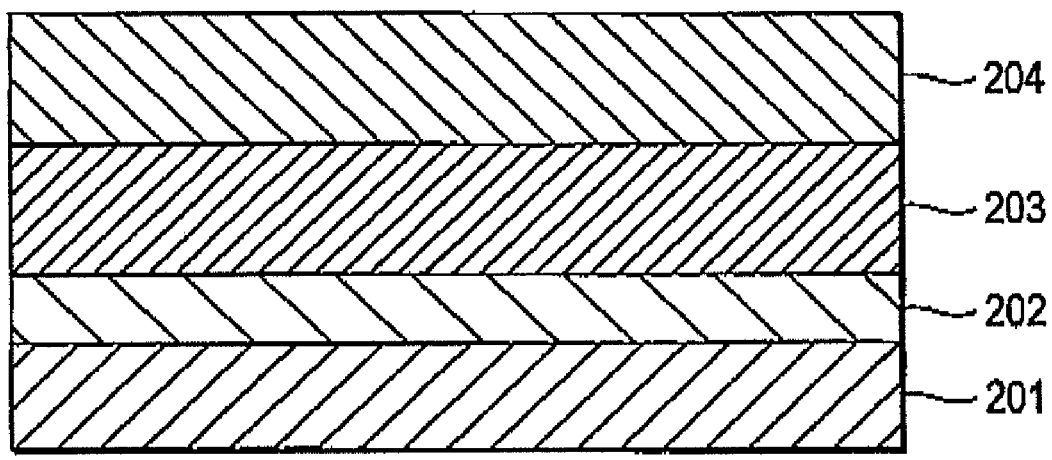
FIG. 1 is a cross-sectional view schematically showing a structure of an organic photoelectric conversion device according to an exemplary embodiment of the present invention.

201: Substrate
202: Electrode
203: Photoelectric conversion layer
204: Electrode
1: Antireflection layer
2: Infrared-cutting dielectric multilayer layer
3, 4, 5: Protective layer
6: Transparent counter electrode
7: Electron blocking layer
8: p Layer
9: n Layer
10: Hole blocking layer
11, 12: Layer containing metal wiring
13: Silicon single-crystal substrate
14: Transparent pixel electrode
15: Plug
16: Pad
17: Light-shielding layer
18: Connection electrode
19: Metal wiring
20: Counter electrode pad
21: n Layer
22: p Layer
23: n Layer
24: p Layer
25: n Layer
26: Transistor
27: Signal read-out pad
101: P Well layer
102, 104, 106: High-concentration impurity region
103, 105, 107: MOS Circuit
108: Gate insulating layer
109, 110; Insulating layer
111, 114, 116, 119, 121, 124: Transparent electrode layer
112, 117, 122: Electrode
113, 118, 123: Photoelectric conversion layer
110, 115, 120, 125: Transparent insulating layer
126: Light-shielding layer
150: Semiconductor substrate

DETAILED DESCRIPTION OF THE EXEMPLARY EMBODIMENTS

According to exemplary embodiments of the present invention, a photoelectric conversion device, a solid-state imaging device and a photosensor each containing an organic material that exhibits high photoelectric conversion efficiency and high-speed responsivity can be obtained.

Exemplary embodiments of the present invention are described in detail below. In an exemplary embodiment of the present invention, a compound represented by formula (1) is used, whereby high photoelectric conversion efficiency and high-speed responsivity can be exhibited in a photoelectric conversion layer, a photoelectric conversion device, an imaging device and a photosensor.

It may be sufficient to have at least one dye compound represented by formula (1). Among merocyanine dyes represented by formula (1), a dye compound represented by formula (2) is preferred.

The compounds represented by formulae (1) and (2) are described below.

In formula (1), $Z_1$ represents an atomic group for forming a 5- or 6-membered nitrogen-containing heterocyclic ring. However, a compound where $Z_1$ is an atomic group forming a thiazoline nucleus or a thiazole nucleus is excluded. Za represents an atomic group for forming a 5- or 6-membered ring. $R_1$ represents a hydrogen atom, an alkyl group, an alkenyl group, an aryl group or a heterocyclic group. $L_{11}$ to $L_{14}$ each represents a methine group which may have a substituent or may form a ring with another methine group. p1 represents 0 or 1. n1 represents an integer of 0 to 4 and when n1 is an integer of 2 or more, each $L_{13}$ or $L_{14}$ may be the same as or different from every other $L_{13}$ or $L_{14}$. M1 represents an ion for neutralizing the electric charge. m1 represents a number necessary for neutralization of the electric charge.

$Z_1$ represents an atomic group for forming a 5- or 6-membered nitrogen-containing heterocyclic ring. Preferred examples of the 5- or 6-membered nitrogen-containing heterocyclic ring formed include an oxazole nucleus having a carbon atom number (hereinafter referred to as a C number) of 3 to 25 (e.g., 2-3-ethyloxazolyl, 2-3-sulfopropyloxazolyl, 2-3-sulfopropylbenzoxazolyl, 2-3-ethylbenzoxazolyl, 2-3-sulfopropyl-γ-naphthoxazolyl, 2,3-ethyl-α-naphthoxazolyl, 2-3-methyl-β-naphthoxazolyl, 2-3-sulfopropyl-β-naphthoxazolyl, 2-5-chloro-3-ethyl-α-naphthoxazolyl, 2-5-chloro-3-ethylbenzoxazolyl, 2-5-chloro-3-sulfopropylbenzoxazolyl, 2-5,6-dichloro-3-sulfopropylbenzoxazolyl, 2-5-bromo-3-sulfopropylbenzoxazolyl, 2-3-ethyl-5-phenylbenzoxazolyl, 2-5-phenyl-3-sulfopropyl-benzoxazolyl, 2-5-(4-bromophenyl)-3-sulfobutylbenzoxazolyl, 2-5-(1-pyrrolyl)-3-sulfopropylbenzoxazolyl, 2-5,6-dimethyl-3-sulfopropylbenzoxazolyl, 2-3-ethyl-5-methoxybenzoxazolyl, 2-3-ethyl-5-sulfobenzoxazolyl), an imidazole nucleus having a C number of 3 to 25 (e.g., 2-1,3-diethylimidazolyl, 2-5,6-dichloro-1,3-diethylbenzimidazolyl, 2-5,6-dichloro-3-ethyl-1-sulfopropylbenzimidazolyl, 2-5-chloro-6-cyano-1,3-diethylbenzimidazolyl, 2-5-chloro-1,3-diethyl-6-trifluoromethylbenzimidazolyl), an indolenine nucleus having a C number of 10 to 30 (e.g., 3,3-dimethyl-1-pentylindolenine, 3,3-dimethyl-1-sulfopropylindolenine, 5-carboxy-1,3,3-trimethylindolenine, 5-carbamoyl-1,3,3-trimethylindolenine, 1,3,3-trimethyl-4,5-benzindolenine), a quinoline nucleus having a C number of 9 to 25 (e.g., 2-1-methylquinolyl, 2-1-sulfobutylquinolyl, 4-1-pentylquinolyl, 4-1-sulfoethylquinolyl, 4-1-methyl-7-chloroquinolyl), a selenazole nucleus having a C number of 3 to 25 (e.g., 2-3-methylbenzoselenazolyl), and a pyridine nucleus having a C number of 5 to 25 (e.g., 2-pyridyl). Other examples include an oxazoline nucleus, a selenazoline nucleus, a tellurazoline nucleus, a tellurazole nucleus, a benzotellurazole nucleus, an imidazoline nucleus, an imidazo(4,5-quinoxaline) nucleus, an oxadiazole nucleus, a thiadiazole nucleus, a tetrazole nucleus, a pyrimidine nucleus, and a pyrrolidine nucleus.

Such a nitrogen-containing heterocyclic ring may be substituent, and examples of the substituent (hereinafter referred to a "substituent W") include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

The heterocyclic ring may be further condensed with another ring. Preferred examples of the ring with which the heterocyclic ring is condensed include a benzene ring, a benzofuran ring, a pyridine ring, a pyrrole ring, an indole ring, and a thiophene ring, with a benzene ring being more preferred. These rings each may further have a substituent (e.g., any of substituents W).

The 5- or 6-membered nitrogen-containing heterocyclic ring formed by $Z_1$ is more preferably an oxazole nucleus, an oxazoline nucleus, a benzimidazole nucleus, an indolenine nucleus or a pyrrolidine nucleus, more preferably an oxazole nucleus or an indolenine nucleus, and most preferably an indolenine nucleus, a benzoxazole nucleus or a naphthoxazole nucleus.

$R_1$ in formulae (1) and (2) is a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl), or a heterocyclic group (preferably having a C number of 1 to 20, e.g., pyridyl, thienyl, furyl, thiazolyl, imidazolyl, pyrazolyl, pyrrolidino, piperidino, morpholino), preferably an alkyl group (more preferably an alkyl group having a C number of 1 to 6).

$R_2$ in the structure represented by formula (2) is a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl, cyanoethyl, ethoxycarbonylmethyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl), or a heterocyclic group (preferably having a C number of 1 to 20, e.g., pyridyl, thienyl, furyl, thiazolyl, imidazolyl, pyrazolyl, pyrrolidino, piperidino, morpholino), preferably an alkyl group (more preferably an alkyl group having a C number of 1 to 6).

$L_{11}$ to $L_{14}$ each represents a methine group which may have a substituent (examples of the preferred substituent are the same as examples of the substituent on $Z_1$), and preferred examples of the substituent include an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group, and a cyano group. The substituent is more preferably an alkyl group. $L_{13}$ and $L_{14}$ each is preferably an unsubstituted methyl group or an alkyl group (preferably having a C number of 1 to 6)-substituted methine group, more preferably an unsubstituted methine group.

$L_{13}$ and $L_{14}$ may combine with each other to form a ring, and preferred examples of the ring formed include a cyclohexene ring, a cyclopentene ring, a benzene ring and a thiophene ring.

p1 is 0 or 1, preferably 0. n1 represents an integer of 0 to 4, preferably from 0 to 3, more preferably 0 or 1. When n1 is 2 or more, each $L_{13}$ or $L_{14}$ may be the same as or different from every other $L_{13}$ or $L_{14}$.

M1 represents an ion for neutralizing the electric charge, and m1 represents a number necessary for neutralization of the electric charge.

The ring formed by Za may be any ring but is preferably a heterocyclic ring (more preferably a 5- or 6-membered heterocyclic ring). Here, the heterocyclic ring may be any heterocyclic ring but is preferably an acidic nucleus of a general merocyanine dye. Za preferably represents the remaining atomic group necessary for forming an acidic nucleus.

The acidic nucleus as referred to herein is described in, for example, James (compiler), *The Theory of the Photographic Process*, 4th ed., pp. 197-200, Macmillan (1977). Specific examples of the acidic nucleus include those described in U.S. Pat. Nos. 3,567,719, 3,575,869, 3,804,634, 3,837,862, 4,002,480 and 4,925,777, JP-A-3-167546, and U.S. Pat. Nos. 5,994,051 and 5,747,236.

The acidic nucleus is preferably an acidic nucleus when forming a heterocyclic ring (preferably a 5- or 6-membered nitrogen-containing heterocyclic ring) comprising carbon, nitrogen and/or chalcogen (typically, oxygen, sulfur, selenium and tellurium) atoms, more preferably an acidic nucleus when forming a 5- or 6-membered nitrogen-containing heterocyclic ring comprising carbon, nitrogen and/or chalcogen (typically, oxygen, sulfur, selenium and tellurium) atoms.

Specific examples of the acidic nucleus include the following nuclei:

nuclei of 2-pyrazolin-5-one, pyrazolidine-3,5-dione, imidazolin-5-one, hydantoin, 2- or 4-thiohydantoin, 2-iminooxazolidin-4-one, 2-oxazolin-5-one, 2-thiooxazoline-2,5-dione, 2-thiooxazoline-2,4-dione, isooxazolin-5-one, 2-thiazolin-4-one, thiazolidin-4-one, thiazolidine-2,4-dione, rhodanine, thiazolidine-2,4-dithione, isorhodanine, indane-1,3-dione, thiophen-3-one, thiophen-3-one-1,1-dioxide, indolin-2-one, indolin-3-one, 2-oxoindazolinium, 3-oxoindazolinium, 5,7-dioxo-6,7-dihydrothiazolo(3,2-a)pyrimidine, cyclohexane-1,3-dione, 3,4-dihydroisoquinolin-4-one, 1,3-dioxane-4,6-dione, barbituric acid, 2-thiobarbituric acid, chroman-2,4-dione, indazolin-2-one, pyrido(1,2-a)pyrimidine-1,3-dione, pyrazolo(1,5-b)-quinazolone, pyrazolo(1,5-a)benzimidazole, pyrazolopyridone, 1,2,3,4-tetrahydroquinoline-2,4-dione, 3-oxo-2,3-dihydrobenzo(d)thiophene-1,1-dioxide, and 3-dicyanomethine-2,3-dihydrobenzo(d)thiophene-1,1-dioxide.

Such an acidic nucleus may be condensed with a ring or may be substituted by a substituent (for example, W described above).

Za is more preferably hydantoin, 2- or 4-thiohydantoin, 2-oxazolin-5-one, 2-thioxazoline-2,4-dione, thiazolidine-2,4-dione, rhodanine, thiazolidine-2,4-dithione, barbituric acid or 2-thiobarbituric acid, still more preferably hydantoin, 2- or 4-thiohydantoin, 2-oxazolin-5-one, rhodanine, barbituric acid or 2-thiobarbituric acid, and most preferably rhodanine.

Y in formula (2) represents O, N(Ra), Se or C(Rb)(Rc). Ra, Rb and Rc each independently represents an alkyl group, an alkenyl group or an aryl group. Y is preferably O or C(Rb)(Rc), and in this case, Rb and Rc each is preferably an alkyl group having a carbon number of 1 to 6. $R_0$ represents a substituent, and the substituent includes the substituent W described above and is preferably an alkyl group, a halogen atom or an aryl group. m0 represents an integer of 0 to 4 and is preferably 0 (in this case, $R_0$ becomes a hydrogen atom) or 1.

$R_1$ and n1 in formula (2) have the same meanings as $R_1$ and n1 in formula (1), and preferred ranges are also the same. $M_1$ and m1 in formula (2) have the same meanings as $M_1$ and m1 in formula (1), and preferred ranges are also the same. $L_{13}$ and $L_{14}$ in formula (2) have the same meanings as $L_{13}$ and $L_{14}$ in formula (1), and preferred ranges are also the same.

Specific examples of the compound represented by formula (1) are set forth below.

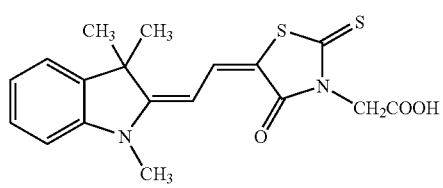
MS-1

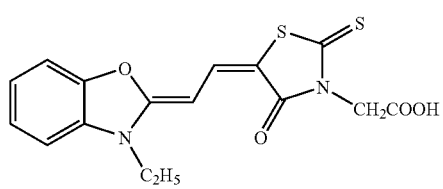
MS-2

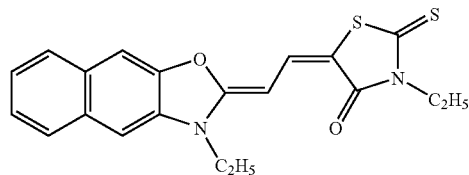
MS-3

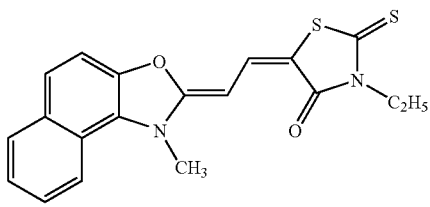
MS-4

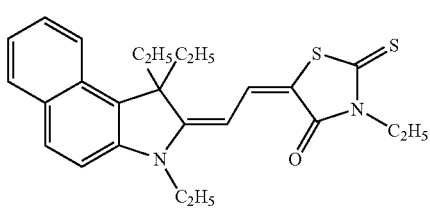
MS-5

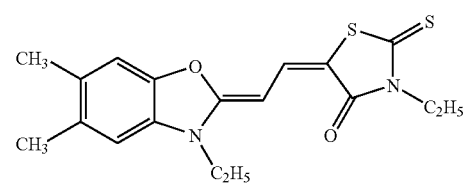
MS-6

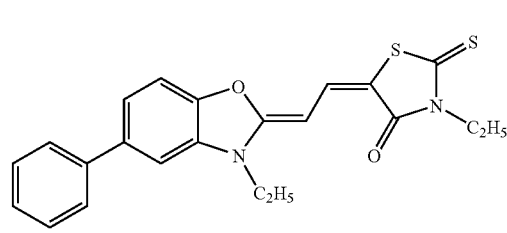
MS-7

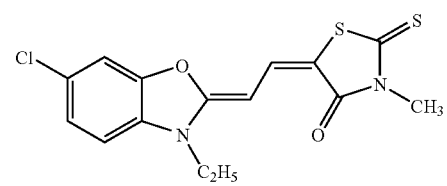
MS-8

The compound for use in the present invention is a known compound such as ordinary merocyanine dye, and such a dye compound can be synthesized by referring, for example, to Dye Publications described later regarding the merocyanine dye.

In the photoelectric conversion device of the present invention, the total thickness of the photoelectric conversion layer is preferably from 100 to 500 nm.

(Orientation Control of Organic Layer)

As for the organic compound used in the organic layer of the photoelectric conversion device, an organic compound having π-conjugated electron is preferably used, and an organic compound where the π-electron plane is oriented not perpendicularly but at an angle closer to parallel with respect to the substrate (electrode substrate) is more preferred. The angle with respect to the substrate is preferably from 0 to 80°, more preferably from 0 to 60', still more preferably from 0 to 40°, yet still more preferably from 0 to 20', even yet still more preferably from 0 to 10°, and most preferably 0° (that is, parallel with respect to the substrate). Such a preferred dye is the merocyanine dye described above.

In the present invention, a color photoelectric conversion device having stacked therein BGR photoelectric conversion layers with good color reproduction, that is, three layers of blue photoelectric conversion layer, green photoelectric conversion layer and red photoelectric conversion layer, may be preferably used. The photoelectric conversion layer of the present invention may be produced as any layer of the BGR photoelectric conversion layers by selecting the substance used, but the layer containing the compound presented by formula (1) is preferably used as blue photoelectric conversion layer or green photoelectric conversion layer.

The compound represented by formula (1) is preferably used as an organic p-type semiconductor.

(Organic Layer)

The organic layer (organic film) for use in the present invention is described below. The electromagnetic wave absorption/photoelectric conversion site comprising the organic layer of the present invention is composed of an organic layer sandwiched by a pair of electrodes. The organic layer is formed of a stack or mixture of an electromagnetic wave absorption site, a photoelectric conversion site, an electron transport site, a hole transport site, an electron blocking site, a hole blocking site, a crystallization preventing site, an electrode, an interlayer contact improving site, and the like.

The organic layer preferably contains an organic p-type semiconductor (compound) and an organic n-type semiconductor (compound), and these compounds may be any compound. The compound may or may not have absorption in the visible and infrared regions, but it is preferred to use at least one compound (organic dye) having absorption in the visible region. Furthermore, colorless p-type and n-type compounds may be used and an organic dye may be added thereto.

The organic p-type semiconductors (compounds) are donor organic semiconductors, are mainly represented by those organic compounds which transport holes, and are organic compounds having electron-donating properties. More particularly, when two organic compounds are used in contact with each other, the organic compound showing a smaller ionization potential is referred to as the organic p-type semiconductor. Therefore, any organic compound that has electron-donating properties can be used as the donor organic compound. For example, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbon ring compounds (e.g., naphthalene derivatives, anthracene derivatives, phenanthrene derivatives, tetracene derivatives, pyrene derivatives, perylene derivatives, and fluoranthene derivatives), and metal complexes having as a ligand a nitrogen-containing hetero ring compound can be used. Additionally, these are not limitative and, as is described above, an organic compound having a smaller ionization potential than the organic compound used as an n-type (acceptor) compound may be used as the donor organic semiconductor.

The organic n-type semiconductors (compounds) are acceptor organic semiconductors (compounds), are mainly represented by those organic compounds which transport electrons, and are organic compounds having electron-accepting properties. More particularly, when two organic compounds are used in contact with each other, the organic compound showing a larger affinity for electron is referred to as the organic n-type semiconductor. Therefore, any organic compound that has electron-accepting properties can be used as the acceptor organic compound. For example, condensed aromatic hydrocarbon ring compounds (e.g., naphthalene derivatives, anthracene derivatives, phenenthrene derivatives, thetracene derivatives, pyrene derivatives, perylene derivatives, and fluoranthene derivatives), 5- to 7-membered hetero ring compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine, tribenzazepine, etc.), polyarylene compounds, fluorine compounds, cyclopentadiene compounds, silyl compounds, and metal complexes having as a ligand a nitrogen-containing hetero ring compound are illustrated. Additionally, these are not limitative and, as is described above, an organic compound having a larger affinity for electron than the organic compound used as a donor organic compound may be used as the acceptor organic semiconductor.

The organic dye for use in the organic layer may be any organic dye, but a p-type organic dye or an n-type organic dye is preferably used. Any organic dyes may be used, and preferred examples thereof include cyanine dyes, styryl dyes, hemicyanine dyes, merocyanine dyes (including zero methine merocyanines (simple merocyanines)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugido dyes, perylene dyes, perinone dyes, phenazine dyes, phenothiazine dyes, quinine dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolo pyrrole dyes, dioxane dyes, porphyrin dyes, chlorophyll dyes, phthalocyanine dyes, metal complex dyes, condensed aromatic hydrocarbon ring series dyes (naphthalene derivatives, anthracene derivatives, phenanthrene derivatives, tetracene derivatives, pyrene derivatives, perylene derivatives, and fluoranthene derivatives).

In the case of a color imaging device which is one of the objects of the present invention, preferred wavelength suitability is sometimes provided by a methine dye having a high degree of freedom of adjusting the absorption wavelength, such as cyanine dye, styryl dye, hemicyanine dye, merocyanine dye, trinuclear merocyanine dye, tetranuclear merocyanine dye, rhodacyanine dye, complex cyanine dye, complex merocyanine dye, allopolar dye, oxonol dye, hemioxonol dye, squarylium dye, croconium dye, and azamethine dye.

These methine dyes are described in detail in the following dye documents.

(Dye Documents)

Examples of the document include F. M. Harmer, *Heterocyclic Compounds-Cyanine Dyes and Related Compounds*, John Wiley & Sons, New York and London (1964), D. M.

Sturmer, *Heterocylic Compounds-Special topics in heterocyclic chemistry*, Chapter 18, Paragraph 14, pp. 482-515, John Wiley & Sons, New York and London (1977), and *Rodd's Chemistry of Carbon Compounds,* 2nd Ed., Vol. IV, Part B, Chapter 15, pp. 369-422, Elsevier Science Publishing Company Inc., New York (1977).

In addition, those described in *Research Disclosure (RD)*, 17643, pp. 23-24; *RD*, 18716, from page 648, right column to page 649, right column, *RD*, 308119, from page 996, right column to page 998, right column, and EP-A1-0565096, page 65, lines 7 to 10 may be preferably used. Furthermore, dyes having a partial structure or a structure represented by a formula or set forth as specific examples in U.S. Pat. Nos. 5,747,236 (in particular, pp. 30-39), 5,994,051 (in particular, pp. 32-43) and 5,340,694 (in particular, pp. 21-58, where, however, in the dyes represented by (XI), (XII) and (XIII), the number of each of $n_{12}$, $n_{15}$, $n_{17}$ and $n_{18}$ is not limited and is an integer of 0 or more (preferably 4 or less)) may also be preferably used.

Next, the metal complex compounds will be described below. The metal complex compounds are metal complexes which have a ligand containing at least one nitrogen atom, oxygen atom or sulfur atom and coordinating to a metal. The metal ion in the metal complex is not particularly limited, but is preferably beryllium ion, magnesium ion, aluminum ion, gallium ion, zinc ion, indium ion, or tin ion, more preferably beryllium ion, aluminum ion, gallium ion, or zinc ion, still more preferably aluminum ion or zinc ion. As the ligand contained in the above-described metal complex, various publicly known ligands may be cited. For example, there are illustrated those ligands which are described in *Photochemistry and Photophysics of Coordination Compounds*, published by Springer-Verlag in 1987 and written by H. Yersin; and *Yuki Kinzoku Kagaku-Kiso to Oyo* published by Shokabo in 1982 and written by Akio Yamamoto.

The ligand is preferably a nitrogen-containing hetero ring ligand (containing preferably from 1 to 30 carbon atoms, more preferably from 2 to 20 carbon atoms, particularly preferably from 3 to 15 carbon atoms and may be a monodentate ligand or a ligand having two or more coordinating sites. The ligand is preferably a bidentate ligand. Examples thereof include a pyridine ligand, a bipyridyl ligand, a quinolinol ligand, a hydroxyphenylazole ligand (e.g., a hydroxyphenylbenzimidazole ligand, a hydroxyphenylbenzoxazole ligand or a hydroxyphenylimidazole ligand)), an alkoxy ligand (containing preferably from 1 to 30 carbon atoms, more preferably from 1 to 20 carbon atoms, particularly preferably from 1 to 10 carbon atoms, and being exemplified by methoxy, ethoxy, butoxy, and 2-ethylhexyloxy), an aryloxy ligand (containing preferably from 6 to 30 carbon atoms, more preferably from 6 to 20 carbon atoms, particularly preferably from 6 to 12 carbon atoms, and being exemplified by phenyloxy, 1-naphthyloxy, 2-nophtyloxy, 2,4,6-trimethylphenyloxy, and 4-biphenyloxy), a heteroaryloxy ligand (containing preferably from 1 to 30 carbon atoms, more preferably from 1 to 20 carbon atoms, particularly preferably from 1 to 12 carbon atoms, and being exemplified by pyridyloxy, pyrazyloxy, pyrimidyloxy, and quinolyloxy), an alkylthio ligand (containing preferably from 1 to 30 carbon atoms, more preferably from 1 to 20 carbon atoms, particularly preferably from 1 to 12 carbon atoms, and being exemplified by methylthio and ethylthio), an arylthio ligand (containing preferably from 6 to 30 carbon atoms, more preferably from 6 to 20 carbon atoms, particularly preferably from 6 to 12 carbon atoms, and being exemplified by phenylthio), a hetero ring-substituted thio ligand (containing preferably from 1 to 30 carbon atoms, more preferably from 1 to 20 carbon atoms, particularly preferably from 1 to 12 carbon atoms, and being exemplified by pyridylthio, 2-benzimidazolylthio, 2-benzoxazolylthio, and 2-benzothiazolylthio), or a siloxy ligand (containing preferably from 1 to 30 carbon atoms, more preferably from 3 to 25 carbon atoms, particularly preferably from 6 to 20 carbon atoms, and being exemplified by a triphenylsiloxy group, a triethoxysiloxy group, and a triisopropylsiloxy group), more preferably a nitrogen-containing hetero ring ligand, an aryloxy ligand, a heteroaryloxy ligand, or a siloxy ligand, sill more preferably a nitrogen-containing hetero ring ligand, an aryloxy ligand, or a siloxy ligand.

The photoelectric conversion layer having a p-type semiconductor layer and an n-type semiconductor layer (preferably a mixed/dispersed (bulk heterojunction structure) layer) between a pair of electrodes is preferably a photoelectric conversion layer containing an orientation-controlled organic compound in at least one of the p-type semiconductor and the n-type semiconductor.

(Formation Method of Organic Layer)

The layer containing such an organic compound is formed by a dry film formation method or a wet film formation method. Specific examples of the dry film formation method include a physical vapor phase growth method such as vacuum vapor deposition method, sputtering method, ion plating method and MBE method, and a CVD method such as plasma polymerization. Examples of the wet film formation method include a casting method, a spin coating method, a dipping method, and an LB method.

In the case where a polymer compound is used as at least one of the p-type semiconductor (compound) and the n-type semiconductor (compound), the organic layer is preferably formed by a wet film formation method in view of easy preparation. In the case of employing a dry film formation method such as vapor deposition, use of a polymer is difficult because decomposition may occur, and an oligomer thereof may be preferably used instead.

On the other hand, in the case where a low molecular compound is used, a dry film formation method is preferably employed, and a vacuum vapor deposition method is particularly preferred. In the vacuum vapor deposition method, the basic parameters are the heating method of compound, such as resistance heating vapor deposition method or electron beam heating vapor deposition method, the shape of vapor deposition source, such as crucible or boat, the degree of vacuum, the vapor deposition temperature, the substrate temperature, the vapor deposition rate, and the like. In order to enable uniform vapor deposition, the compound is preferably vapor-deposited while rotating the substrate. The degree of vacuum is preferably higher, and the vacuum vapor deposition is performed at $10^{-4}$ Torr or less, preferably $10^{-6}$ Torr or less, more preferably $10^{-8}$ Torr or less. During vapor deposition, all steps are preferably performed in vacuum. Fundamentally, care should be taken not to allow the compound to come into direct contact with external oxygen or moisture. These conditions in the vacuum vapor deposition affect the crystallinity, amorphous property, density, compactness and the like of the organic layer and therefore, must be strictly controlled. The PI or PID control of the vapor deposition rate by using a layer thickness monitor such as quartz oscillator or interferometer is preferably employed. In the case of vapor depositing two or more kinds of compounds at the same time, a co-vapor deposition method, a flash vapor deposition method or the like may be preferably employed.

(Definition of Absorption Wavelength)

In the present invention, as described above, a photoelectric conversion device having stacked therein BGR photoelectric conversion layers with good color reproduction, that is, three layers of a blue photoelectric conversion layer, a green photoelectric conversion layer and a red photoelectric conversion layer, can be preferably used. Each photoelectric conversion layer preferably has the following spectral absorption and/or spectral sensitivity properties.

Assuming that spectral absorption maximum values are $\lambda max1$, $\lambda max2$ and $\lambda max3$ in the order of BGR and spectral sensitivity maximum values are Smax1, Smax2 and Smax3 in the order of BGR, the $\lambda max1$ and Smax1 are preferably from 400 to 500 nm, more preferably from 420 to 480 nm, still more preferably from 430 to 470 nm; the $\lambda max2$ and Smax2 are preferably from 500 to 600 nm, more preferably from 520 to 580 nm, still more preferably from 530 to 570 nm; and the $\lambda max3$ and Smax3 are preferably from 600 to 700 nm, more preferably from 620 to 680 nm, still more preferably from 630 to 670 nm.

Also, in the case where the photoelectric conversion layer of the present invention takes a stacked structure of three or more layers, the gap between shortest and longest wavelengths exhibiting 50% of each of the spectral maximum absorption of $\lambda max1$, $\lambda max2$ and $\lambda max3$ and the spectral maximum sensitivity of Smax1, Smax2 and Smax3 is preferably 120 nm or less, more preferably 100 nm or less, still more preferably 80 nm or less, and most preferably 70 nm or less.

The gap between shortest and longest wavelengths exhibiting 80% of each of the spectral maximum absorption of $\lambda max1$, $\lambda max2$ and $\lambda max3$ and the spectral maximum sensitivity of Smax1, Smax2 and Smax3 is preferably 20 nm or more and preferably 100 nm or less, more preferably 80 nm or less, still more preferably 50 nm or less.

The gap between shortest and longest wavelengths exhibiting 20% of each of the spectral maximum absorption of $\lambda max1$, $\lambda max2$ and $\lambda max3$ and the spectral maximum sensitivity of Smax1, Smax2 and Smax3 is preferably 180 nm or less, more preferably 150 nm or less, still more preferably 120 nm or less, and most preferably 100 nm or less.

Furthermore, on the long wavelength side of $\lambda max1$, $\lambda max2$ and $\lambda max3$ and that of Smax1, Smax2 and Smax3, the longest wavelength exhibiting a spectral absorptance of 50% of each of the spectral maximum absorption of $\lambda max1$, $\lambda max2$ and $\lambda max3$ and the spectral maximum sensitivity of Smax1, Smax2 and Smax3 is preferably from 460 to 510 nm for $\lambda max1$ and Smax1, from 560 to 610 nm for $\lambda max2$ and Smax2, and from 640 to 730 nm for $\lambda max3$ and Smax3.

When the spectral absorption wavelength and spectral sensitivity regions of the compound for use in the present invention fall within the ranges above, the color reproducibility of a color image obtained by the imaging device can be enhanced.

(Definition of Thickness of Organic Dye Layer)

In the case of using the photoelectric conversion layer of the present invention as a color imaging device (image sensor), for the purpose of enhancing the photoelectric conversion efficiency and further improving color separation without passing excessive light to a lower layer, the light absorptance of each organic dye layer of B, G and R layers is preferably set to be 50% or more, more preferably 70% or more, still more preferably 90% (absorbance=1) or more, and most preferably 99% or more. Accordingly, in view of light absorption, the thickness of the organic dye layer is preferably larger, but considering the rate of contribution to the electric charge separation, the thickness of the organic dye layer for use in the present invention is preferably from 30 to 300 nm, more preferably from 50 to 250 nm, still more preferably from 60 to 200 nm, and most preferably from 80 to 130 nm.

(Application of Voltage)

Application of a voltage to the photoelectric conversion layer of the present invention is preferred, because the photoelectric conversion efficiency is enhanced. The voltage applied may be any voltage, but the necessary voltage varies depending on the thickness of the photoelectric conversion layer. That is, the photoelectric conversion efficiency is more enhanced as the electric field added to the photoelectric conversion layer is larger, but even with the same voltage applied, the electric field added becomes larger as the thickness of the photoelectric conversion layer is smaller. Accordingly, in the case where the thickness of the photoelectric conversion layer is thin, the voltage applied may be relatively small. The electric field added to the photoelectric conversion layer is preferably $10^{-2}$ V/cm or more, more preferably 10 V/cm or more, still more preferably $1\times10^3$ V/cm or more, yet still more preferably $1\times10^4$ V/cm or more, and most preferably $1\times10^5$ V/cm or more. Although there is no particular upper limit, when an excessive electric field is added, an electric current disadvantageously flows even in a dark place and therefore, the electric field is preferably $1\times10^{10}$ V/cm or less, more preferably $1\times10^7$ V/cm or less.

(General Requirements)

In the present invention, the photoelectric conversion device preferably takes a construction where at least two layers, more preferably three or four layers, still more preferably three layers, are stacked.

In the present invention, such a photoelectric conversion device can be preferably used as an imaging device, more preferably as a solid-state imaging device. Also, in the present invention, it is preferred to apply a voltage to such a photoelectric conversion layer, a photoelectric conversion device and an imaging device.

The photoelectric conversion device of the present invention preferably comprises a photoelectric conversion layer having a structure where a p-type semiconductor layer and an n-type semiconductor layer are stacked between a pair of electrodes. A stacked structure where at least one of the p-type and n-type semiconductors contains an organic compound is preferred, and a structure where both the p-type and n-type semiconductors contain an organic compound is more preferred.

(Bulk Heterojunction Structure)

In the present invention, it is preferred to contain a photoelectric conversion layer (photosensitive layer) having a p-type semiconductor layer and an n-type semiconductor layer between a pair of electrodes, where at least either the p-type semiconductor layer or the n-type semiconductor layer is an organic semiconductor and a bulk heterojunction structure layer containing the p-type semiconductor and n-type semiconductor is formed as an intermediate layer. In the photoelectric conversion layer, by virtue of containing a bulk heterojunction structure in the organic layer, the drawback that the carrier diffusion length of the organic layer is short can be compensated for and the photoelectric conversion efficiency can be enhanced.

Incidentally, the bulk heterojunction structure is described in detail in JP-A-2005-042356 (Japanese Patent Application No. 2004-080639).

(Tandem Structure)

In the present invention, it is preferred to contain a photoelectric conversion layer (photosensitive layer) having a structure where two or more repeating structures (tandem structure) of the pn junction layer formed by a p-type semiconductor layer and an n-type semiconductor layer are present between a pair of electrodes. Also, a thin layer formed of an electrically conductive material may be inserted between those repeating structures. The electrically conductive material is preferably silver or gold, and most preferably silver. The number of repeating structures (tandem structure) of the pn junction layer may be any number but in order to raise the photoelectric conversion efficiency, is preferably from 2 to 100, more preferably from 2 to 50, still more preferably from 5 to 40, and most preferably from 10 to 30.

In the present invention, the semiconductor having a tandem structure may be an inorganic material but is preferably an organic semiconductor, more preferably an organic dye.

Incidentally, the tandem structure is described in detail in JP-A-2005-042356 (Japanese Patent Application No. 2004-079930).

(Stacked Structure)

As one preferred embodiment of the present invention, in the case of not applying a voltage to the photoelectric conversion layer, at least two photoelectric conversion layers are preferably stacked. The stacked imaging device is not particularly limited and those used in this field all can be applied, but a BGR three-layer stacked structure is preferred and FIG. 2 shows a preferred example of the BGR stacked structure.

The solid-state imaging device of the present invention has, for example, a photoelectric conversion layer as described in this embodiment. In the solid-state imaging device shown in FIG. 2, a stacked photoelectric conversion layer is provided on a scanning circuit part. As for the scanning circuit part, a construction where an MOS transistor is formed on a semiconductor substrate for each pixel unit, or a construction having CCD as an imaging device may be appropriately employed.

For example, in the case of a solid-state imaging device using an MOS transistor, an electric charge is generated in a photoelectric conversion layer by the effect of incident light transmitted through an electrode, and the electric charge is caused to run to an electrode within the photoelectric conversion layer by an electric field produced between the electrodes when applying a voltage to the electrodes and is further transferred to a charge accumulating part of the MOS transistor and accumulated in the charge accumulating part. The electric charge accumulated in the charge accumulating part is transferred to a charge readout part by the switching of the MOS transistor and further output as an electric signal, whereby signals of a full-color image are input in a solid-state imaging device containing a signal processing part.

Figure 2:
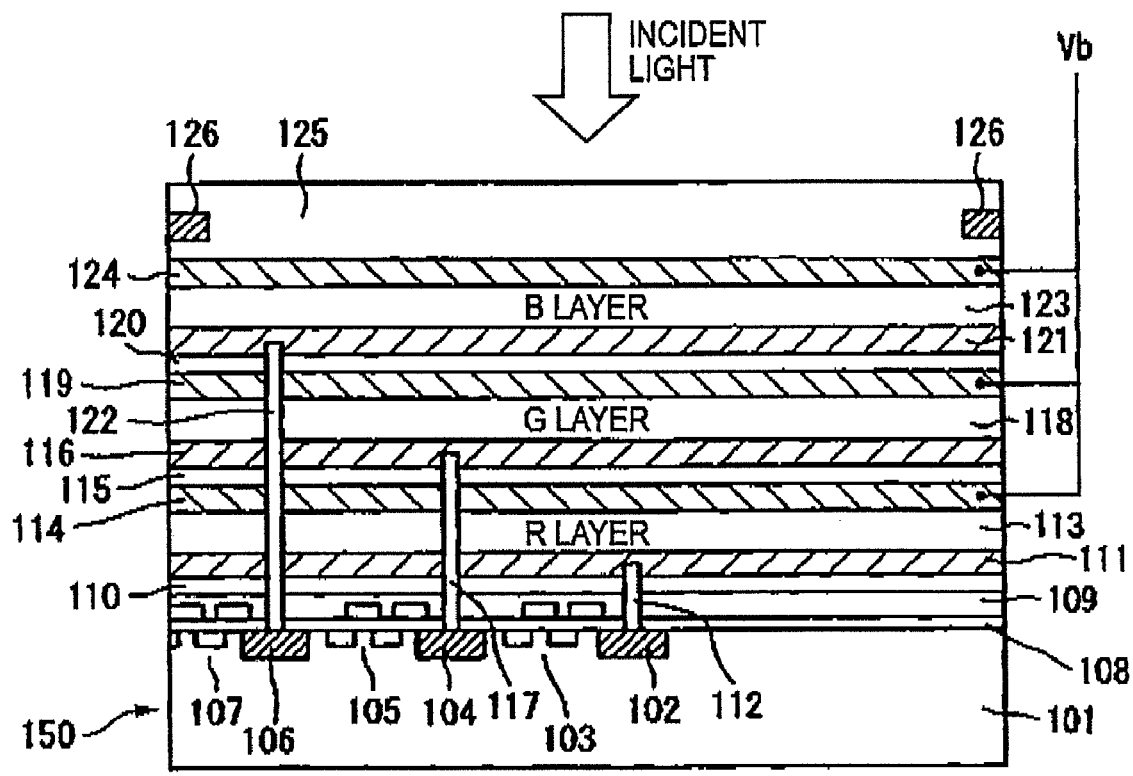
FIG. 2 is a cross-sectional schematic view of an imaging device according to an exemplary embodiment of the present invention.

As for such a stacked imaging device, a solid-state color imaging device as represented by those shown, for example, in FIG. 2 of JP-A-58-103165 and FIG. 2 of SP-A-58-103166 may also be applied.

As regards the production process of the stacked imaging device described above, preferably three-layer stacked imaging device, the method described in JP-A-2002-83946 (see, FIGS. 7 to 23 and paragraphs (0026) to (0038) of the same) can be applied.

(Photoelectric Conversion Device)

The photoelectric conversion device in a preferred embodiment of the present invention is described below.

The photoelectric conversion device of the present invention is composed of an electromagnetic wave absorption/photoelectric conversion site and a site for charge accumulation/transfer/read-out of the electric charge produced by photoelectric conversion.

In the present invention, the electromagnetic wave absorption/photoelectric conversion site has a stacked structure of at least two layers capable of absorbing and photoelectrically converting each of blue light green light and red light. A blue light absorbing layer (B) can absorb at least light at 400 to 500 nm, and the absorptance at the peak wavelength in that wavelength region is preferably 50% or more. A green light absorbing layer (G) can absorb at least light at 500 to 600 nm, and the absorptance at the peak wavelength in that wavelength region is preferably 50% or more. A red light absorbing layer (R) can absorb at least light at 600 to 700 nm, and the absorptance at the peak wavelength in that wavelength region is preferably 50% or more. The order of these layers may be any order. In the case of a three-layer stacked structure, orders of BGR, BRG, GBR, GRB, RBG and RGB from the upper layer (light incident side) can be employed. Preferably, the uppermost layer is G. In the case of a two-layer stacked structure, when the upper layer is an R layer, BG layers are formed as lower layers on the same plane; when the upper layer is a B layer, GR layers are formed as lower layers on the same plane; and when the upper layer is a G layer, BR layers are formed as lower layers on the same plane. Preferably, the upper layer is a G layer and BR layers are lower layers on the same plane. In the case where two light absorbing layers are thus provided as lower layers on the same plane, a filter layer capable of differentiating colors is preferably provided, for example, in a mosaic state on the upper layer or between the upper layer and the lower layer. Depending on the case, a fourth or greater layer may be provided as a new layer or on the same plane.

In the present invention, the charge accumulation/transfer/read-out site is provided under the electromagnetic wave absorption/photoelectric conversion site. The electromagnetic wave absorption/photoelectric conversion site as a lower layer preferably serves also as the charge accumulation/transfer/read-out site.

In the present invention, the electromagnetic wave absorption/photoelectric conversion site is composed of an organic layer, an inorganic layer, or a mixture of an organic layer and an inorganic layer. An organic layer may form B/G/R layers or an inorganic layer may form B/G/R layers. A mixture of an organic layer and an inorganic layer is preferred. In this case, fundamentally, one or two layers are an inorganic layer when one layer is an organic layer, and one layer is an inorganic layer when two layers are an organic layer. In the case where one layer is an organic layer and one layer is an inorganic layer, the inorganic layer forms electromagnetic wave absorption/photoelectric conversion sites for two or more colors on the same plane. It is preferred that the upper layer is an organic layer and is a G layer and the lower layers are an inorganic layer and are a B layer and an R layer in this order from the upper side. Depending on the case, a fourth or greater layer may be provided as a new layer or on the same plane. In the case where an organic layer forms B/G/R layers, a charge accumulation/transfer/read-out site is provided thereunder. Also, in the case where an inorganic layer is used as the electromagnetic wave absorption/photoelectric conversion site, this inorganic layer serves also as the charge accumulation/transfer/read-out site.

In the present invention, out of the devices described above, one preferred embodiment is as follows.

A construction having at least two electromagnetic wave absorption/photoelectric conversion sites with at least one site thereof being the photoelectric conversion device (preferably imaging device) of the present invention is preferred.

Also, a construction where at least two electromagnetic wave absorption/photoelectric conversion sites are a device having a stacked structure of at least two layers is preferred, and a construction where the upper layer is a device comprising a site capable of absorbing and photoelectrically converting green light is more preferred.

In particular, a construction having at least three electromagnetic wave absorption/photoelectric conversion sites with at least one site thereof being the photoelectric conversion device (preferably, imaging device) of the present invention is preferred.

A construction where the upper layer is a device comprising a site capable of absorbing and photoelectrically converting green light is preferred, and a construction where at least two members out of three electromagnetic wave absorption/photoelectric conversion sites are an inorganic layer (preferably formed within a silicon substrate) is more preferred.

(Hole Blocking Layer)

The hole blocking layer is formed of a material transparent to light in the region from visible to infrared, because light needs to be incident on the photoelectric conversion layer. Also, the hole blocking layer has a function of suppressing injection of a hole from the upper electrode into the photoelectric conversion layer when applying a bias voltage between the lower electrode and the upper electrode. Furthermore, the hole blocking layer needs to have a function of transporting an electron generated in the photoelectric conversion layer to the upper electrode. Incidentally, when the lower electrode is an electrode for collecting electrons, the hole blocking layer may be provided between the photoelectric conversion layer and the lower electrode.

If a hole blocking layer is not formed on the photoelectric conversion layer and an upper electrode is produced directly thereon, the photoelectric conversion layer may be damaged during film formation of the upper electrode, or an organic material constituting the photoelectric conversion layer may interact with a material of the upper electrode to form a new localized level on the interface between the photoelectric conversion layer and the upper electrode. The hole blocking layer prevents an increase in the dark current due to accelerated injection of a hole from the upper electrode through the localized level and is preferably formed of a stable inorganic material that scarcely interacts with either one or both of a material of the photoelectric conversion layer and a material of the upper electrode. Also, the number of localized levels is proportional to the area of the interface with the upper electrode and therefore, the hole blocking layer is preferably amorphous so that the interface with the electrode can be as smooth as possible. Furthermore, the hole blocking layer is preferably formed of a material capable of being formed by a physical vapor phase deposition method enabling continuous production with the photoelectric conversion layer and the upper electrode under vacuum conditions, such as vacuum vapor deposition method, sputtering method, ion plating method and electron beam epitaxy method, so as to prevent water, oxygen or the like that deteriorates the photoelectric conversion layer from being mixed after the formation of the photoelectric conversion layer.

Examples of the inorganic material satisfying the conditions above include an oxide, specifically, aluminum oxide, silicon oxide, titanium oxide, vanadium oxide, manganese oxide, iron oxide, cobalt oxide, zinc oxide, niobium oxide, molybdenum oxide, cadmium oxide, indium oxide, tin oxide, barium oxide, tantalum oxide, tungsten oxide and iridium oxide. Such an oxide is preferably an oxide with lower oxygen than in the definite composition (stoichiometric composition), because the electron transporting property is elevated. A hole blocking layer composed of such an inorganic material is formed between the photoelectric conversion layer and the upper electrode for collecting electrons, whereby an organic photoelectric conversion device reduced in the dark current by suppressing the injection of a hole from the upper electrode without decreasing the external quantum efficiency and assured of high SN ratio can be realized.

(Electron Blocking Layer)

For the electron blocking layer, an electron-donating organic material can be used. Specifically, examples of the low molecular material which can be used include an aromatic diamine compound such as N,N'-bis(3-methylphenyl)-(1,1'-biphenyl)-4,4'-diamine (TPD) and 4,4'-bis(N-(naphthyl)-N-phenylamino)biphenyl (α-NPD), oxazole, oxadiazole, triazole, imidazole, imidazolone, a stilbene derivative, a pyrazolone derivative, tetrahydroimidazole, a polyarylalkane, butadiene, 4,4',4''-tris(N-(3-methylphenyl) N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styrylanthracene derivative, a fluorenone derivative, a hydrazone derivative, and a silazane derivative. As for the polymer material, a polymer such as phenylenevinylene, fluorene, carbazole, indole, pyrene, pyrrole, picolin, thiophene, acetylene and diacetylene, or a derivative thereof may be used. A compound having a sufficient hole transporting property may be used even if it is not an electron-donating compound.

The thickness of the electron blocking layer is preferably from 10 to 200 mm, more preferably from 30 to 150 nm, still more preferably from 50 to 100 nm. If this thickness is too small, the effect of suppressing a dark current is decreased, whereas if it is excessively large, this causes reduction in the photoelectric conversion efficiency.

Also, specific examples of the compound preferred as the electron blocking material include Compounds (1) to (16) described in JP-A-2007-59517, paragraphs 0036 to 0037, TPD, and m-MTDATA.

(Electrode)

The electromagnetic wave absorption/photoelectric conversion site composed of an organic layer for use in the present invention is sandwiched between a pair of electrodes forming a pixel electrode and a counter electrode, respectively. It is preferred that the lower layer is a pixel electrode.

The counter electrode preferably extracts a hole from a hole-transporting photoelectric conversion layer or a hole transport layer, and examples of the material preferably used therefor include a metal, an alloy, a metal oxide, an electrically conductive compound, and a mixture thereof. The pixel electrode preferably extracts an electron from an electron-transporting photoelectric conversion layer or an electron transport layer, and the material therefor is selected by taking into consideration the adhesion to an adjacent layer such as electron-transporting photoelectric conversion layer and electron transport layer, the electron affinity, the ionization potential, the stability and the like. Specific examples thereof include an electrically conductive metal oxide such as tin oxide, zinc oxide, indium oxide and indium tin oxide (ITO), a metal such as gold, silver, chromium and nickel, a mixture or stack of such a metal and such an electrically conductive metal oxide, an inorganic electrically conductive substance such as copper iodide and copper sulfide, an organic electrically conductive material such as polyaniline, polythiophene and polypyrrole, a silicon compound, and a stack thereof with ITO. Of these, an electrically conductive metal oxide is preferred, and ITO and IZO are more preferred in view of productivity, high electrical conductivity, transparency and the like. The layer thickness may be appropriately selected according to the material but in general, is preferably from 10 nm 1 μm, more preferably from 30 to 500 nm, still more preferably from 50 to 300 nm.

For the production of the pixel electrode and counter electrode, various methods may be used according to the material but, for example, in the case of ITO, the film formation is performed by a method such as electron beam method, sputtering method, resistance heating vapor deposition method, chemical reaction method (e.g., sol-gel method) and coating of a dispersion of indium tin oxide. In the case of ITO, a UV-ozone treatment, a plasma treatment, or the like can be applied.

In the present invention, it is preferred to produce a transparent electrode layer in a plasma-free state. By forming a transparent electrode layer in a plasma-free state, the effect of the plasma on the substrate can be reduced and good photoelectric conversion properties can be provided. Here, the term "plasma-free state" means a state where a plasma is not generated during film formation of the transparent electrode layer or where the distance from the plasma generation source to the substrate is 2 cm or more, preferably 10 cm or more, more preferably 20 cm or more, and the plasma that reaches the substrate is reduced.

The apparatus where a plasma is not generated during film formation of the transparent electrode layer includes, for example, an electron beam vapor deposition apparatus (EB vapor deposition apparatus) and a pulse laser vapor deposition apparatus. As for the EB vapor deposition apparatus and pulse laser vapor deposition apparatus, there may be used an apparatus described, for example, in Yutaka Sawada (supervisor), *Toumei Doden Maku no Shin Tenkai* (*New Development of Transparent Electrically Conductive Film*), CMC (1999), Yutaka Sawada (supervisor), *Toumei Doden Maku no Shin Tenkai II* (*New Development II of Transparent Electrically Conductive Film*), CMC (2002), *Toumei Doden Maku no Gijutsu* (*Technology of Transparent Electrically Conductive Film*), Japan Society for the Promotion of Science, Ohm-sha (1999), and references and the like recited therein. In the following, the method of performing the film formation of the transparent electrode layer by using an EB vapor deposition apparatus is referred to as an "EB vapor deposition method", and the method of performing the film formation of the transparent electrode layer by using a pulse laser vapor deposition apparatus is referred to as a "pulse laser vapor deposition method".

As for the apparatus capable of realizing the state where the distance from the plasma generation source to the substrate is 2 cm or more and the plasma that reaches the substrate is reduced (hereinafter referred to as a "plasma-free film-forming apparatus"), for example, a counter target-type sputtering apparatus and an arc plasma vapor deposition method may be possible. In this regard, there may be used an apparatus described, for example, in Yutaka Sawada (supervisor), *Toumei Doden Maku no Shin Tenkai* (*New Development of Transparent Electrically-Conductive Film*), CMC (1999), Yutaka Sawada (supervisor), *Toumei Doden Maku no Shin Tenkai II* (*New Development II of Transparent Electrically Conductive Film*), CMC (2002), *Toumei Doden Maku no Gijutsu* (*Technology of Transparent Electrically Conductive Film*), Japan Society for the Promotion of Science, Ohm-sha (1999), and references and the like recited therein.

The electrode of the organic electromagnetic wave absorption/photoelectric conversion site in the present invention is described in more detail below. The photoelectric conversion layer as an organic layer is sandwiched by a pixel electrode layer and a counter electrode layer and may contain an inter-electrode material or the like. The pixel electrode layer indicates an electrode layer produced above a substrate on which a charge accumulation/transfer/read-out site is formed, and is usually divided for every one pixel, so that a signal charge converted through the photoelectric conversion layer can be read out on a charge accumulation/transfer/signal read-out circuit substrate for every one pixel and an image can be thereby obtained.

The counter electrode layer has a function of discharging a signal charge having a polarity opposite to that of a signal charge by sandwiching the photoelectric conversion layer together with the pixel electrode layer. This discharge of a signal charge need not be divided among respective pixels and therefore, the counter electrode layer can be usually shared in common by respective pixels. For this reason, the counter electrode layer is sometimes called a shared electrode layer (common electrode layer).

The photoelectric conversion layer is positioned between the pixel electrode layer and the counter electrode layer. The photoelectric conversion function is exerted by these photoelectric convention layer, pixel electrode layer and counter electrode layer.

Examples of the construction of the photoelectric conversion layer stack include, in the case of stacking one organic layer on a substrate, a construction where a pixel electrode layer (fundamentally a transparent electrode layer), a photoelectric conversion layer and a counter electrode layer (transparent electrode layer) are stacked in this order from the substrate, but the present invention is not limited thereto.

In the case of stacking two organic layers on a substrate, examples of the construction include a construction where a pixel electrode layer (fundamentally a transparent electrode layer), a photoelectric conversion layer, a counter electrode layer (transparent electrode layer), an inter-level insulating layer, a pixel electrode layer (fundamentally a transparent electrode layer), a photoelectric conversion layer, and a counter electrode layer (transparent electrode layer) are stacked in this order from the substrate.

The material for the transparent electrode layer constituting the photoelectric conversion site in the present invention is preferably a material capable of being formed by a plasma-free film-forming apparatus, an EB vapor deposition apparatus or a pulse laser vapor deposition apparatus. Suitable examples of such a material include a metal, an alloy, a metal oxide, a metal nitride, a metal boride, an organic electrically conductive compound, and a mixture thereof. Specific examples thereof include an electrically conductive metal oxide such as tin oxide, zinc oxide, indium oxide, indium zinc oxide (IZO), indium tin oxide (ITO) and indium tungsten oxide (IWO), a metal nitride such as titanium nitride, a metal such as gold, platinum, silver, chromium, nickel and aluminum, a mixture or stack of such a metal and such an electrically conductive metal oxide, an inorganic electrically conductive substance such as copper iodide and copper sulfide, an organic electrically conductive material such as polyaniline, polythiophene and polypyrrole, and a stack thereof with ITO. Furthermore, there may also be used those described in detail, for example, in Yutaka Sawada (supervisor), *Toumei Doden Maku no Shin Tenkai* (*New Development of Transparent Electrically Conductive Film*), CMC (1999), Yutaka Sawada (supervisor), *Toumei Doden Maku no Shin Tenkai II* (*New Development II of Transparent Electrically Conductive Film*), CMC (2002), and *Toumei Doden Maku no Gijutsu* (*Technology of Transparent Electrically Conductive Film*), Japan Society for the Promotion of Science, Ohm-sha (1999).

In particular, the material for the transparent electrode layer is preferably any one material of ITO, IZO, $SnO_2$, ATO (antimony-doped tin oxide), ZnO, AZO (Al-doped zinc oxide), GZO (gallium-doped zinc oxide), $TiO_2$ and FTO (fluorine-doped tin oxide).

The light transmittance of the transparent electrode layer is preferably 60% or more, more preferably 80% or more, still more preferably 90% or more, yet still more preferably 95% or more, at the photoelectric conversion light absorption peak wavelength of a photoelectric conversion layer contained in a photoelectric conversion device containing the transparent electrode layer. The surface resistance of the transparent electrode layer varies in its preferred range depending on whether the transparent electrode layer is a pixel electrode or a counter electrode, whether the charge accumulation/transfer/read-out site is of a CCD structure or a CMOS structure, or the like. In the case where the transparent electrode layer is used for a counter electrode and the charge accumulation/transfer/read-out site is of a CMOS structure, the surface resistance is preferably 10,000 Ω/square or less, more preferably 1,000 Ω/square or less. In the case where the transparent electrode layer is used for a counter electrode and the charge accumulation/transfer/read-out site is of a CCD structure, the surface resistance is preferably 1,000 Ω/square or less, more preferably 100 Ω/square or less. In the case of using the transparent electrode layer for a pixel electrode, the surface resistance is preferably 1,000,000 Ω/square or less, more preferably 100,000 Ω/square or less.

The conditions at the film formation of the transparent electrode layer are described below. The substrate temperature during film formation of the transparent electrode layer is preferably 500° C. or less, more preferably 300° C. or less, still more preferably 200° C. or less, yet still more preferably 150° C. or less. A gas may be introduced during film formation of the transparent electrode, and the gas species is fundamentally not limited but, for example, Ar, He, oxygen or nitrogen may be used. A mixed gas of such gases may also be used. In particular, in the case of an oxide material, oxygen deficiency often occurs and therefore, oxygen is preferably used, (Inorganic Layer)

The inorganic layer as the electromagnetic wave absorption/photoelectric conversion site is described below. In this case, light passed through an organic layer as the upper layer is photoelectrically converted in the inorganic layer. The inorganic layer which is generally used is pn junction or pin junction of crystalline silicon, amorphous silicon or a compound semiconductor such as GaAs. As for the stacked structure, the method disclosed in U.S. Pat. No. 5,965,875 may be employed. That is, there may be employed a construction where a light-receiving part stacked by utilizing wavelength dependency of the absorption coefficient of silicon is formed and color separation is performed in the depth direction thereof. In this case, color separation is performed by the light penetration depth of silicon and therefore, the spectrum range detected in each of stacked light-receiving parts becomes broad. However, by using the above-described organic layer as the upper layer, that is, by allowing light passed through the organic layer to be detected in the depth direction of silicon, color separation is remarkably improved. In particular, when a G layer is disposed in the organic layer, light passed through the organic layer becomes B light and R light, and only BR light is subjected to differentiation of light in the depth direction of silicon, as a result, color separation is improved. Even when the organic layer is a B layer or an R layer, by appropriately selecting the electromagnetic wave absorption/photoelectric conversion site of silicon in the depth direction, color separation is remarkably improved. In the case where the organic layer is composed of two layers, the function as the electromagnetic wave absorption/photoelectric conversion site of silicon is fundamentally sufficient if it is brought out for one color, and preferred color separation can be achieved.

The inorganic layer preferably has a structure such that a plurality of photodiodes are superposed for every pixel in the depth direction within a semiconductor substrate and a color signal corresponding to a signal charge generated in each photodiode by the effect of light absorbed in the plurality of photodiodes is read out to the outside. It is preferred that the plurality of photodiodes contain a first photodiode provided at a depth for absorbing B light and at least one second photodiode provided at a depth for absorbing R light and are equipped with a color signal read-out circuit for reading out a color signal according to the signal charge generated in each of the plurality of photodiodes. By virtue of this construction, color separation can be performed without using a color filter. Depending on the case, light of a negative sensitive component can also be detected, and this enables color imaging with good color reproducibility. In the present invention, it is preferred that the junction part of the first photodiode is formed at a depth of about 0.2 μm from the semiconductor substrate surface and the junction part of the second photodiode is formed at a depth of about 2 μm from the semiconductor substrate surface.

The inorganic layer is described in more detail. The preferred construction of the inorganic layer includes a light-receiving device of photoconductive type, p-n junction type, Schottky junction type, PIN junction type or MSM (metal-semiconductor-metal) type, and a phototransistor type light-receiving device. In the present invention, it is preferred to use a light-receiving device where a plurality of regions of first conductivity type and a plurality of regions of second conductivity type which is a conductivity type opposite to the first conductivity type are alternately stacked within a single semiconductor substrate and the junction planes each between regions of first conductivity type and second conductivity type are formed at respective depths suitable for photoelectrically converting mainly light in a plurality of different wavelength bands. The single semiconductor substrate is preferably single-crystal silicon, and color separation can be effected by utilizing the absorption wavelength property dependent on the depth direction of the silicon substrate.

The inorganic semiconductor may also be an InGaN-based, InAlN-based, InAlP-based or InGaAlP-based inorganic semiconductor. The InGaN-based inorganic semiconductor is an inorganic semiconductor adjusted to have a maximum absorption value in the blue wavelength range by appropriately changing the In-containing composition. That is, the composition becomes $In_xGa_{1-x}N$ (0<x<1).

Such a compound semiconductor is produced by using a metal organic chemical vapor deposition method (MOCVD method). An InAlN-based nitride semiconductor using Al which is the same Group 13 raw material as Ga may also be used as a short wavelength light-receiving part, similarly to the InGaN-based semiconductor. Also, InAlP or InGaAlP that lattice-matches with a GaAs substrate may be used.

The inorganic semiconductor may be of a buried structure. The "buried structure" as used herein indicates a construction where both ends of a short wavelength light-receiving part are covered by a semiconductor different from the short wavelength light-receiving part. The semiconductor for covering both ends is preferably a semiconductor having a band gap wavelength shorter than or equal to the band gap wavelength of the short wavelength light-receiving part.

The organic layer and the inorganic layer may be coupled in any form. For ensuring electrical insulation between the organic layer and the inorganic layer, an insulating layer is preferably provided therebetween.

The junction is preferably npn or pnpn from the light incident side. In particular, pnpn junction is more preferred, because by providing a p layer on the surface and making high the surface potential, a hole generated in the vicinity of the surface and a dark current can be trapped and the dark current can be reduced.

In such a photodiode, when an n-type layer, a p-type layer, an n-type layer and a p-type layer, through which diffusion proceeds successively from the p-type silicon substrate surface, are formed deeply in this order, the pn-junction diode is formed of pnpn four layers in the depth direction of silicon. Out of light incident on the diode from the surface side, light at a longer wavelength penetrates more deeply and since the incident wavelength and the attenuation coefficient take values inherent to silicon, the photodiode is designed such that the depth of the pn junction plane covers respective wavelength bands of visible light. Similarly, a junction diode of npn three layers is obtained by forming an n-type layer, a p-type layer and n-type layer in this order. Here, a light signal is extracted from the n-type layer, and the p-type layer is connected to a grounding wire.

Also, when an extraction electrode is provided in each region and a predetermined reset potential is applied, each region is depleted, and the capacity of each junction part becomes a boundlessly small value, so that the capacity generated on the junction plane can be made extremely small.

(Auxiliary Layer)

In the present invention, an ultraviolet absorbing layer and/or an infrared absorbing layer is preferably provided as an uppermost layer of the electromagnetic wave absorption/photoelectric conversion site. The ultraviolet absorbing layer can absorb or reflect at least light at 400 nm or less, and the absorptance in the wavelength region of 400 nm or less is preferably 50% or more. The infrared absorbing layer can absorb or reflect at least light at 700 nm or more, and the absorptance in a wavelength region of 700 nm or more is preferably 50% or more.

Such an ultraviolet absorbing layer or infrared absorbing layer can be formed by a conventionally known method. For example, there is known a method where a mordant layer composed of a hydrophilic polymer substance such as gelatin, casein, glue and polyvinyl alcohol is provided on a substrate and a dye having a desired absorption wavelength is added to or used to stain the mordant layer, thereby forming a colored layer. Furthermore, a method of using a colored resin obtained by dispersing a certain kind of coloring material in a transparent resin is known. For example, as described in JP-A-58-46325, JP-A-60-78401, JP-A-60-184202, JP-A-60-184203, JP-A-60-184204 and JP-A-60-184205, a colored resin layer formed by mixing a coloring material in a polyamino-based resin may be used. Also, a colorant using a polyimide resin having photosensitivity may be used.

It is also possible to disperse a coloring material in an aromatic polyamide resin containing a photosensitive group within the molecule and capable of obtaining a cured layer at 200° C. or less described in JP-B-7-113685 (the term "JP-B" as used herein means an "examined Japanese patent publication") or use a colored resin having dispersed therein a pigment described in JP-B-7-69486.

In the present invention, dielectric multi layers are preferably used. The dielectric multilayer film has sharp wavelength dependency of light transmission and is preferred.

The electromagnetic wave absorption/photoelectric conversion sites are preferably separated from each other by an insulating layer. The insulating layer can be formed using a transparent insulating material such as glass, polyethylene, polyethylene terephthalate, polyethersulfone and polypropylene. Also, for example, silicon nitride or silicon oxide may be preferably used. Silicon nitride film-formed by plasma CVD has high compactness and good transparency and therefore, is preferably used in the present invention.

For the purpose of preventing contact with oxygen, moisture or the like, a protective layer or a sealing layer may also be provided.

Examples of the protective layer include a diamond thin layer, an inorganic material layer such as metal oxide and metal nitride, a polymer layer such as fluororesin, poly-p-xylene, polyethylene, silicone resin and polystyrene resin, and a photocurable resin. It is also possible to cover a device portion, for example, by glass, a gas-impermeable plastic or a metal and package the device itself with a suitable sealing resin. In this case, a substance having high water absorbability may be allowed to be present in the packaging.

Furthermore, the light collection efficiency can be enhanced by forming a microlens array in the upper part of the light-receiving device, and therefore, such an embodiment is also preferred.

(Charge Accumulation/Transfer/Read-Out Site)

The charge accumulation/transfer/read-out site is described, for example, in JP-A-58-103166, JP-A-58103165 and SP-A-2003-332551. A construction where an MOS transistor is formed on a semiconductor substrate for every pixel unit, or a construction having CCD as a device may be appropriately employed. For example, in the case of a photoelectric conversion device using an MOS transistor, an electric charge is generated in a photoconductive layer by the effect of incident light passed through an electrode, and the electric charge is caused to run to an electrode within the photoconductive layer by an electric field produced between the electrodes when applying a voltage to the electrodes and is further transferred to a charge accumulating part of the MOS transistor and accumulated in the charge accumulating part. The electric charge accumulated in the charge accumulating part is transferred to a charge read-out part by the switching of the MOS transistor and further output as an electric signal, whereby signals of a full-color image are input in a solid-state imaging device containing a signal processing part.

A signal charge can be read out after injecting a fixed amount of bias charge into the accumulation diode (refresh mode) and accumulating a fixed amount of electric charge (photoelectric conversion mode). The light-receiving device itself may be used as the accumulation diode, or an accumulation diode may be separately provided.

The read-out of the signal is described in more detail below. For reading out the signal, a normal color read-out circuit may be used. A signal charge or signal current after light/electric conversion in the light-receiving part is accumulated in the light-receiving part itself or in a capacitor separately provided. The accumulated charge is read out together with the selection of the pixel position by means of an MOS-type imaging device (so-called CMOS sensor) using an X-Y address system. Other examples of the address selection system include a system where pixels are successively selected one by one by a multiplexer switch and a digital shift register and read out as a signal voltage (or electric charge) on a common output line. An imaging device employing a two-dimensionally arrayed X-Y address operation is known as a CMOS sensor. In this imaging device, a switch provided in a pixel connected to an X-Y intersection point is connected to a vertical shift register, and when the switch is turned on by the effect of a voltage from the vertical scanning shift register, signals read out from pixels provided in the same line are read out on the output line in the column direction. The signals are successively read out from an output end through the switch driven by a horizontal scanning shift register.

For reading out the output signal, a floating diffusion detector or a floating gate detector can be used. Also, S/N can be enhanced by providing a signal amplification circuit in the pixel portion or by means of correlate double sampling.

For the signal processing, gamma correction by an ADC circuit, digitization by an AD transducer, luminance signal processing, and color signal processing can be applied. The color signal processing includes white balance processing, color separation processing, color matrix processing, and the like. In use for an NTSC signal, conversion processing of an RGB signal into a YIQ signal may be applied.

The charge transfer/read-out site needs to have a charge mobility of 100 $cm^2$/vol·sec or more, This mobility can be obtained by selecting the material from semiconductors of Group IV, Group III-V and Group II-VI. Above all, a silicon semiconductor (sometimes referred to as an "Si semiconductor") is preferred because of advancement of miniaturization technology and low cost. As for the charge transfer/charge read-out system, a large number of proposals have been made, and any system may be employed. In particular, a COMS-type or CCD-type device is a preferred system. Furthermore, in the present invention, a CMOS-type device is often preferred from the standpoints such as high-speed read-out, pixel addition, partial read-out and power consumption.

(Connection)

A plurality of contact sites for joining the electromagnetic wave absorption/photoelectric conversion side with the charge transfer/read-out site each may be joined using any metal, but the metal is preferably selected from copper, aluminum, silver, gold, chromium and tungsten, and copper is more preferred. Contact sites each with the charge transfer/read-out site need to be provided according to the plurality of electromagnetic wave absorption/photoelectric conversion sites. In the case of employing a stacked structure comprising a plurality of photosensitive units of blue, green and red lights, joining needs to be performed between a blue light extraction electrode and the charge transfer/read-out site, between a green light extraction electrode and the charge transfer/read-out site, and between a red light extraction electrode and the charge transfer/read-out site.

(Process)

The stacked photoelectric conversion device of the present invention can be produced according to a so-called known microfabrication process that is employed in the production of an integrated circuit or the like. Basically, this process is effected by a repeated operation of pattern exposure with active light, electron beam or the like (i- or g-bright line of mercury, excimer laser, or even X-ray or electron beam), pattern formation by development and/or burning, alignment (e.g., coating, vapor deposition, sputtering, CV) of the device-forming material, and removal (e.g., heat treatment, dissolution treatment) of the material in the non-pattern area, (Usage)

The chip size of the device may be a brownie size, a 135 size, an APS size or a 1/1.8-inch size, or a smaller size may also be selected. The pixel size of the stacked photoelectric conversion device of the present invention is expressed by an equivalent-circle diameter corresponding to the maximum area of a plurality of electromagnetic absorption/photoelectric conversion sites. Any pixel size may be employed, but the pixel size is preferably from 2 to 20 microns, more preferably from 2 to 10 microns, still more preferably from 3 to 8 microns.

If the pixel size exceeds 20 microns, the resolving power decreases, and if the pixel size is less than 2 microns, the resolving power also decreases due to radio wave interference between sizes.

The photoelectric conversion device of the present invention can be utilized for a digital still camera and is also preferably used for a TV camera. Other examples of the usage to which the photoelectric conversion device of the present invention can be applied include a digital video camera, a monitor camera (m, for example, an office building, a parking lot, an unmanned loan dispensing system by financial institution, a shopping center, a convenience store, an outlet mall, a department store, a Japanese pinball parlor, a karaoke box, a game center, or a hospital), other various sensors (TV door phone, identity authentication sensor, factory automation sensor, home robot, industrial robot, piping inspection system), a medical sensor (endoscope, fundus camera), a video-conference system, a videophone, a camera-equipped mobile phone, an automobile safety running system (back guide monitor, collision prediction, lane-keeping system), and a video game sensor.

Above all, the photoelectric conversion device of the present invention is suitable for use in a television camera. The reason therefor is because no color separation optical system is required and this enables achieving miniaturization and weight reduction of a television camera. Also, the photoelectric conversion device of the present invention has high sensitivity and high resolving power and therefore, use in a television camera for high-definition broadcasting is particularly preferred. In this case, the term "television camera for high-definition broadcasting" as used herein includes a camera for digital high-definition broadcasting.

Furthermore, the photoelectric conversion device of the present invention is advantageous in that an optical low pass filter can be dispensed with and higher sensitivity and higher resolving power can be expected.

In addition, the photoelectric conversion device of the present invention can be thinned and at the same time, can dispense with a color separation optical system. Accordingly, with respect to shooting scenes differing in the required sensitivity, for example, "environments differing in the brightness, such as daytime and nighttime" and "immobile subject and mobile subject", and other shooting scenes differing in the required spectral sensitivity or color reproducibility, a single camera can respond to various needs for shooting by exchanging the photoelectric conversion device of the present invention. Also, a plurality of cameras need not be carried at the same time and therefore, the load on a photographer is lightened. As for the photoelectric conversion device to be exchanged, in addition to the above, exchangeable photoelectric conversion devices may be prepared for the purpose of infrared shooting, black-and-white shooting, and dynamic range changing.

The TV camera of the present invention can be produced by referring to the description in *Television Camera no Sekkei Gijutsu (Design Technologies Camera)*, Chapter 2, edited by the Institute of Image Information and Television Engineers, published by Corona Sha, ISBN 4-339-00714-5 (Aug. 20, 1999), for example, by replacing the portions of color separation optical system and imaging device in the basic construction of a television camera shown in FIG. 2.1 by the photoelectric conversion device of the present invention.

The stacked light-receiving device above can be utilized not only as an imaging device by arraying it but also can be utilized in a single body as an optical sensor such as biosensor or chemical sensor or as a color light-receiving device.

(Preferred Photoelectric Conversion Device of the Present Invention)

The preferred photoelectric conversion device of the present invention is described below by referring to FIG. 3. In the Figure, 13 is a silicon single-crystal substrate and serves as both an electromagnetic wave absorption/photoelectric conversion site for B light and R light and a charge accumulation/transfer/read-out site of an electric charge generated by photoelectric conversion. Usually, a p-type silicon substrate is used. Numerals 21, 22 and 23 indicate an n layer, a p layer and an n layer, respectively, provided in the silicon substrate. The n layer 21 is an accumulation part for a signal charge of R light and accumulates a signal charge of R light after photoelectric conversion by pn junction. The accumulated electric charge is connected to a signal read-out pad 27 by metal wiring 19 via a transistor 26. The n layer 23 is an accumulation part for a signal charge of B light and accumulates a signal charge of B light after photoelectric conversion by pn junction. The accumulated electric charge is connected to the signal read-out pad 27 by metal wiring 19 via a transistor similar to the transistor 26. Here, the p layer, n layer, transistor, metal wiring and the like are schematically shown, but, as described in detail above, an optimal structure and the like are selected for each of these members. The B light and R light are differentiated by the depth of the silicon substrate and therefore, for example, selection of the depth of pn junction or the like from silicon substrate and the dope concentration is important. Numeral 12 is a layer containing metal wiring and is a layer containing silicon oxide, silicon nitride or the like as the main component. The thickness of the layer 12 is preferably as thin as possible and is 5 μm or less, preferably 3 μm or less, more preferably 2 μm or less. Numeral 11 is also a layer containing silicon oxide, silicon nitride or the like as the main component. In the layers 11 and 12, a plug for sending a signal charge of G light to the silicon substrate is provided. The plugs are connected between the layers 11 and 12 by a pad 16. A plug containing tungsten as the main component is preferably used, and a pad containing aluminum as the main component is preferably used. A barrier layer including the metal wiring above is preferably provided. The signal charge of G light, after being sent via the plug 15, is accumulated in an n layer 25 in the silicon substrate. The n layer 25 is separated by a p layer 24, The accumulated charge is connected to the signal read-out pad 27 by the metal wiring 19 via a transistor similar to the transistor 26. The photoelectric conversion by the pn junction of the layers 24 and 25 becomes a noise and therefore, a light-shielding layer 17 is provided in the layer 11. A light-shielding layer containing tungsten, aluminum or the like as the main component is usually used. The thickness of the layer 12 is preferably as thin as possible and is 3 μm or less, preferably 2 μm or less, more preferably 1 μm or less. The signal read-out pad 27 is preferably provided for every each signal of B, G and R signals. This process can be achieved by a conventionally known process, so-called CMOS process.

The electromagnetic wave absorption/photoelectric conversion site of G light is indicated by numerals 6, 7, 8, 9, 10 and 14. Numerals 6 and 14 are a transparent electrode and correspond to a counter electrode and a pixel electrode, respectively. The pixel electrode 14 is a transparent electrode, but for establishing good electrical connection with the plug 15, the connection part often requires a site of aluminum, molybdenum or the like. Bias is applied between these transparent electrodes through wiring from a connection electrode 18 and a counter electrode pad 20. A structure allowing an electron to be accumulated in the layer 25 by applying positive bias to the pixel electrode 14 with respect to the transparent counter electrode 6 is preferred. In this case, 7 is an electron blocking layer, 8 is a p layer, 9 is an n layer, and 10 is a hole blocking layer, showing a representative layer construction of the organic layer. The total thickness of the organic layer consisting of 7, 8, 9 and 10 is preferably 0.5 μm or less, more preferably 0.4 pn or less, still more preferably 0.3 μm or less. The thickness of each of the transparent counter electrode 6 and the transparent pixel electrode 14 is preferably 0.2 μm or less. Numerals 3, 4 and 5 are a protective layer containing silicon nitride or the like as the main component. By virtue of these protective layers, the production process of layers containing the organic layer becomes easy. In particular, these layers can reduce the damage on the organic layer during resist pattern preparation, etching or the like at the preparation of a connection electrode such as 18. In order to avoid the resist pattern preparation, etching and the like, production using a mask is also possible. As long as the conditions above are satisfied, the thickness of each of the protective layers 3, 4 and 5 is preferably 0.5 μm or less, Numeral 3 is a protective layer of the connection electrode 18, 2 is infrared-cutting dielectric multi layers, and 1 is an anti-reflection layer. The total thickness of the layers 1, 2 and 3 is preferably 1 μm or less.

The photoelectric conversion device described above by referring to FIG. 3 has a construction of arraying one B pixel and one R pixel for four G pixels. The photoelectric conversion device may have a construction of arraying one B pixel and one R pixel for one G pixel, a construction of arraying one B pixel and one R pixel for three G pixels, a construction of arraying one B pixel and one R pixel for two G pixels, or an arbitrary combination thereof. These are preferred embodiments of the present invention, but the present invention is not limited thereto.

EXAMPLES

Examples of the present invention described below, but the present invention should not be construed as being limited thereto.

Example 1

Amorphous ITO of 100 nm was formed by sputtering on a cleaned glass substrate and patterned by photolithography to produce a pixel electrode while allowing one pixel to be present every each electrode. Thereon, compound A of 100 m and Organic Dye Compound MS-1 of 100 mm and further thereon, silicon oxide of 40 nm each was formed by vacuum heating vapor deposition to produce a photoelectric conversion layer. Furthermore, as the upper electrode, amorphous ITO of 5 nm was formed by sputtering to produce a transparent electrode, whereby a solid-state imaging device was produced (Device 1).

Example 2

A solid-state imaging device (Device 2) was produced thoroughly in the same manner except that in Example 1, Organic Dye Compound (MS-2) of the present invention was used in place of Organic Dye Compound (MS-1) of the present invention.

Comparative Example 1

A solid-stage imaging device (Comparative Device 1) was produced thoroughly in the same manner except that in Example 1, Comparative Organic Dye was used in place of Organic Dye Compound (MS-1) of the present invention.

The relative sensitivity at the maximum sensitivity wavelength of each of solid-state imaging devices of Examples 1 and 2 and Comparative Example 1 is shown in Table 1.

Incidentally, at the time of measuring the photocurrent of each solid-state imaging device, an appropriate voltage was applied.

Table 1.

TABLE 1

| Device No. | Organic Dye | Relative Sensitivity (photoelectric conversion efficiency) |
|---|---|---|
| 1 | MS-1 | 1.8 |
| 2 | MS-2 | 1.7 |
| Comparative Device 1 | Comparative Organic Dye | 1 |

Devices 1 and 2 of the present invention both exhibited high photoelectric conversion efficiency as compared with Comparative Device 1.

Compound A

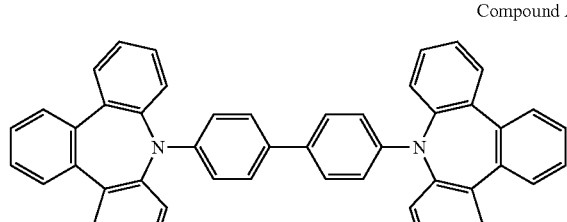

Comparative Organic Dye

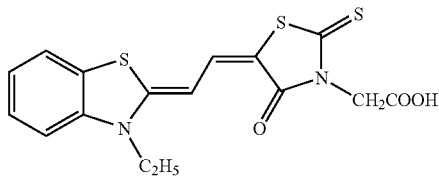

Example 3

A cleaned ITO (glass) substrate was placed in a vapor deposition apparatus, Organic Dye Compound (MS-3) was vapor-deposited to a thickness of 200 nm, a patterned mask (a mask giving a light-receiving area of 2 mm×2 mm) was provided on the organic thin layer, and aluminum was vapor-deposited to a thickness of 100 nm, whereby a photoelectric conversion device was produced (device 3).

Comparative Example 2

A photoelectric conversion device (Comparative Device 2) was produced thoroughly in the same manner except that in the device of Comparative Example 3, Comparative Organic Dye was used in place of Organic Dye Compound (MS-3) of the present invention.

Bias of 10 V was applied to each of Device 3 and Comparative Device 3 by assigning minus to the ITO side and plus to the aluminum electrode side, and the time required until reaching 95% of the saturated value of photocurrent was evaluated. The results are shown in Table 2.

TABLE 2

| Device No. | Organic Dye | Response Time Until Reaching 95% of Photocurrent |
|---|---|---|
| 3 | MS-3 | 80 μs |
| Comparative Device 2 | Comparative Organic Dye | 5 ms |

The response time of Device 3 which is Example of the present invention was about 2-digit faster than that of Comparative Device 2.

(Another Embodiments)

When the device of Example 1, 2 or 3 of the present invention is used for the G layer shown in FIG. 2, a color imaging device exhibiting excellent color separation can be produced.

Figure 3:
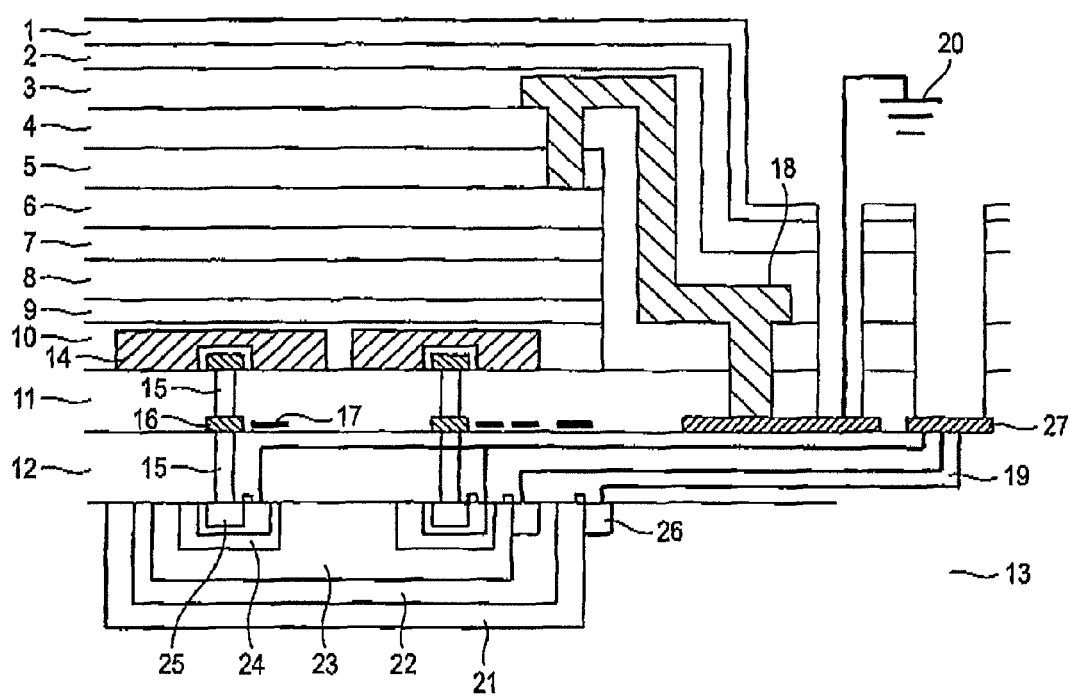
FIG. 3 is a cross-sectional schematic view of one pixel portion of a BGR three-layer stacked photoelectric conversion device according to an exemplary embodiment of the present invention, wherein descriptions of reference numerals and signs in the figures are set forth below.

When the G light-absorbing photoelectric conversion site of Example 1, 2 or 3 is used for the portions of photoelectric conversion sites 8 and 9 shown in FIG. 3, a color imaging device exhibiting excellent color separation can be produced.

What is claimed is:

1. A photoelectric conversion device comprising
a pair of electrodes; and
a photoelectric conversion layer disposed between the pair of electrodes,
wherein the photoelectric conversion layer comprises a compound represented by formula (2):

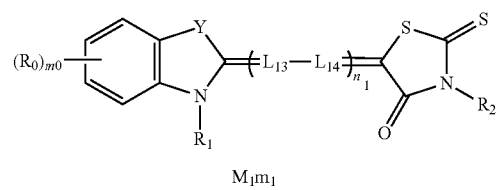

wherein Y represents O, N(Ra), Se or C(Rb)(Rc); Ra, Rb and Rc each independently represents an alkyl group, an alkenyl group or an aryl group; $R_0$ represents a substituent; m0 represents an integer of 2; $R_1$ and $R_2$ each independently represents a hydrogen atom, an alkyl group, an alkenyl group, an aryl group or a heterocyclic group; $L_{13}$ and $L_{14}$ each represents a methine group which may have a substituent or may form a ring with another methine group or $R_1$; n1 represents an integer of 0 to 4 and when n1 is an integer of 2 or more, plural $L_{13}$'s may be the same or different from each other $L_{13}$ and plural $L_{14}$'s may be the same or different from each other; M1 represents an ion for neutralizing an electric charge of the compound; and m1 represents a number necessary for neutralization of the electric charge,
wherein $R_0$'s are bonded with each other to form a benzene ring.

2. The photoelectric conversion device according to claim 1, wherein $R_1$ represents a hydrogen atom or an alkyl group.

3. The photoelectric conversion device according to claim 1, wherein $R_2$ represents a hydrogen atom or an alkyl group.

4. The photoelectric conversion device according to claim 1, wherein n1 represents an integer of 0 to 3.

5. The photoelectric conversion device according to claim 4, wherein n1 represents an integer of 0 or 1.

6. The photoelectric conversion device according to claim 1, wherein Y represents O or C(Rb)(Rc), and Rb and Rc each independently are an alkyl group having a carbon atom number of 1 to 6.

7. The photoelectric conversion device according to claim 1, wherein the photoelectric conversion layer is formed by a vacuum vapor deposition method.

8. An imaging device comprising a photoelectric conversion device according to claim 1.

9. A photosensor comprising a photoelectric conversion device according to claim 1.

10. A photosensor comprising a photoelectric conversion device according to claim 1, wherein Y represents O.

11. The photoelectric conversion device according to claim 1, wherein a voltage is applied between the pair of electrodes.

* * * * *